(12) United States Patent
Overall

(10) Patent No.: US 6,552,542 B1
(45) Date of Patent: Apr. 22, 2003

(54) OSCILLATING DUAL-EQUILIBRIUM STEADY STATE ANGIOGRAPHY USING MAGNETIC RESONANCE IMAGING

(75) Inventor: William R. Overall, Menlo Park, CA (US)

(73) Assignee: The Board of Trustees of The Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/967,644

(22) Filed: Sep. 28, 2001

(51) Int. Cl.[7] ................................................ G01V 3/00
(52) U.S. Cl. ...................... 324/309; 324/306; 324/307
(58) Field of Search .................... 324/309, 307, 324/306, 312, 314, 322; 600/412; 128/653.2

(56) References Cited

U.S. PATENT DOCUMENTS

| 4,115,730 A | 9/1978 | Mansfield |
| 4,528,985 A | 7/1985 | Macovski |
| 4,595,879 A | 6/1986 | Lent et al. |
| 4,609,872 A | 9/1986 | O'Donnell |
| 4,683,431 A | 7/1987 | Pattany et al. |
| 4,718,424 A | 1/1988 | Nishimura |
| 4,954,779 A | 9/1990 | Zur |
| 6,310,478 B1 * | 10/2001 | Heid .......................... 324/309 |

* cited by examiner

Primary Examiner—Edward Lefkowitz
Assistant Examiner—Brij B. Shrivastav
(74) Attorney, Agent, or Firm—Townsend and Townsend and Crew LLP; Henry K. Woodward

(57) ABSTRACT

A method of oscillating dual-equilibrium steady-state angiography (ODESSA), utilizes a modified steady state free precession (SSFP) pulse sequence. The SSFP sequence is modified such that flowing material reaches a steady state which oscillates between two equilibrium values, while stationary material attains a standard, non-oscillatory steady state. When alternating sequences are employed, subtraction of adjacent echoes results in large, uniform signal from all flowing spins and zero signal from stationary spins. Venous signal can be suppressed based on its reduced $T_2$. ODESSA arterial signal is more than three times as large as that of traditional phase-contrast angiography (PCA) in the same scan time, and also compares favorably with other techniques of MR angiography. Pulse sequences are implemented in 2D, 3D, and volumetric projection modes. Angiograms of the lower leg, generated in as few as 5 s, show high arterial SNR and full suppression of other tissues.

26 Claims, 7 Drawing Sheets

OSCILLATING DUAL-EQUILIBRIUM STEADY STATE ANGIOGRAPHY USING MAGNETIC RESONANCE IMAGING

STATEMENT AS TO RIGHTS TO INVENTIONS MADE UNDER FEDERALLY SPONSORED RESEARCH OR DEVELOPMENT

This invention was made with Government support under contract HL07846 awarded by the National Institutes of Health. The Government has certain rights in this invention.

BACKGROUND OF THE INVENTION

This invention relates generally to magnetic resource imaging (MRI), and more particularly the invention relates to magnetic resonance angiography (MRA) using an oscillating dual-equilibrium steady state free precession process.

Magnetic resonance angiography (MRA) is a clinically relevant non-invasive alternative to traditional X-ray angiography. A number of approaches have been used to isolate signal from vessels. Inflow-based methods, such as time-of-flight and spin-tagging, waste significant scan time while waiting for inflow to occur and may suffer from reduced signal in distal portions of the artery being imaged. Flow-independent techniques make use of the inherent $T_1$ and $T_2$ relaxation times of arterial and venous blood to generate the desired contrast. However, these techniques suffer from incomplete suppression of background signal and may require careful selection of numerous scan parameters for ideal performance.

Phase contrast angiography (PCA) makes use of the phase accrual of moving transverse spins during the application of a gradient. This technique can suppress background signal very well; however, the resulting blood signal strength is proportional to flow in the direction of flow sensitivity. As a result, three acquisitions are often required to get uniform signal from the extent of the vessel. Care must also be taken to match the velocity sensitivity of the sequence to the flow rate in the vessel of interest. Finally, because signal phase is proportional to velocity, thick-slab images suffer from signal loss in pixels where multiple vessels overlap.

$T_1$-shortening contrast agents, primarily gadolinium compounds, have also been used successfully to produce angiographic images. These techniques boost blood signal while keeping background signal from other spins constant; this background signal can reduce image contrast. Moreover, several doses of contrast agent are often required in order to produce the necessary contrast, and acquisitions must be carefully timed in order to isolate arterial signal.

BRIEF SUMMARY OF THE INVENTION

The invention is a new angiographic process, which is denoted oscillating dual-equilibrium steady state angiography (ODESSA). This method incorporates velocity-dependent phase shifts into a modified steady state free precession (SSFP) process in order to select a blood vessel signal. Refocused SSFP pulse sequences, which refocus all magnetization over the RF repetition interval TR, provide a means of rapid imaging while maintaining high signal. Until recently, these methods have been largely ignored for imaging applications because of their sensitivity to off-resonant precession. Recently, high-performance imaging systems have allowed refocused SSFP sequences with very short TRs, which minimize these unwanted artifacts.

More particularly, the invention utilizes short-TR refocused SSFP sequences to rapidly produce images with angiographic contrast. In order to isolate signal from blood, an oscillating steady state is generated for flowing material through the periodic addition of a bipolar flow-encoding pulse, such as every second TR, for example. Static tissue is unaffected by this bipolar pulse, and thus approaches a single steady state. Addition of adjacent echoes produces anatomic contrast similar to that of standard SSFP sequences. Subtraction of adjacent echoes results in suppression of signal from stationary tissue, while the signal from flowing blood retains the high SNR expected of SSFP sequences. Furthermore, the subtracted signal from flowing blood is uniform in magnitude and phase over a wide range of velocities. Therefore, scans with multiple directions of velocity sensitivity may not be necessary, and thick-slab projection imaging is possible. Contrast between arterial and venous blood can be adjusted through manipulation of the RF tip angle. The technique can also be used in conjunction with a $T_1$-shortening contrast agent to further enhance SNR.

The invention and objects and features thereof will be more readily apparent from the following description and appended claims when taken with the drawings.

DETAILED DESCRIPTION OF ILLUSTRATIVE EMBODIMENTS

Figure 1A:
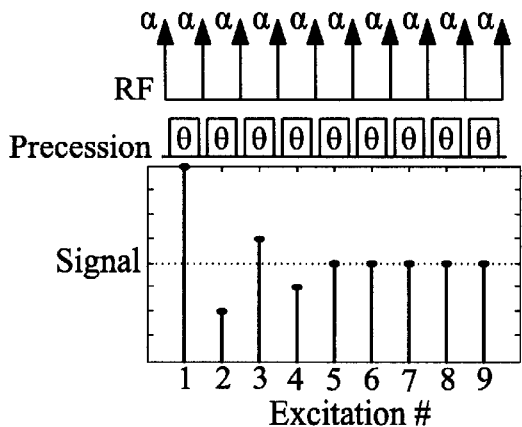
FIGS. 1(a) and 1(b) illustrate SSFP processes for constant TR precession and constant RF tips and for either the RF tips or the precession is periodic, respectively.
Figure 1B:
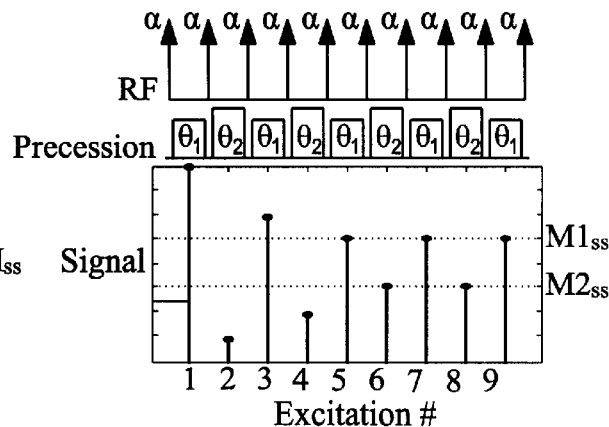

FIGS. 1(a) and 1(b) illustrate the key differences between a conventional SSFP sequence and a SSFP sequence employing ODESSA, in accordance with the invention.

A "standard" refocused SSFP pulse sequence (FIG. 1a) consists of equal α-tips separated by an RF repetition time (TR). During each TR interval, transverse spins precess by an angle $\theta=\theta_F+\theta_I$. $\theta_F$ represents free precession from various sources of off-resonance, and $\theta_I$ represents precession induced by the pulse sequence. Put another way, $\theta_I$ represents those components of intra-TR precession which the pulse sequence designer can manipulate. In a standard refocused SSFP sequence, magnetization after the nth tip ($\vec{M}_n$) approaches a steady state $\vec{M}_{ss}$ for large n:

$$\vec{M}_n = \vec{M}_{n+1} = \vec{M}_{ss} \text{ for all n sufficiently large.} \quad (1)$$

In contrast, an "oscillating" steady state sequence (FIG. 1b) repeats a pattern of tips and precession periodically in order to produce useful contrast. Herein, we explore only those sequences with a repetition interval of 2·TR, in which case the steady state conditions are $$\vec{M}_{2n-1} = \vec{M}_{2n+1} = \vec{M}_{ss1}$$

$$\vec{M}_{2n} = \vec{M}_{2n+2} = \vec{M}_{ss2} \text{ for all n sufficiently large.} \quad (2)$$

Hence, two distinct steady states, $\vec{M}_{ss1}$ and $\vec{M}_{ss2}$, are produced.

Oscillating steady states generated by periodically varying RF phase are well-documented. Altering the RF phase linearly (e.g., phase schedules of $\{0°, 180° \ldots\}$ or $\{0°, 90°, 180°, 270° \ldots\}$) shifts the response of the steady state with respect to $\theta$. Other RF phase schedules can be used to reduce sensitivity to off-resonant precession or to selectively image water and fat.

An oscillating steady state can also be obtained by periodically varying the amount of precession induced within TR, $\theta_I$. If the amount of precession induced during odd and even TR intervals ($\theta_{I1}$ and $\theta_{I2}$, respectively) is manipulated such that $\theta_{I1}=\theta_{I2}$ for static tissue and $\theta_{I1}\neq\theta_{I2}$ for moving tissue, then an oscillating steady state occurs only for moving tissue. The complex difference between adjacent echoes in the steady state, defined as $$\vec{D}_{ss} = \vec{M}_{ss} - \vec{M}_{ss1}, \quad (3)$$

can then be used to isolate signal from moving tissue.

Figure 2A:
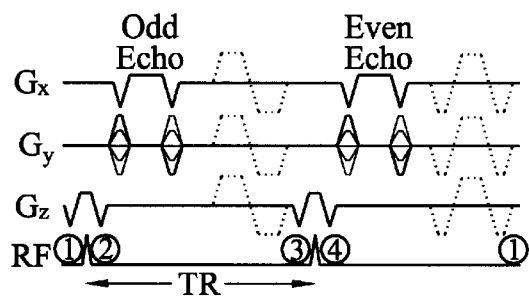
FIGS. 2(a) and 2(b) illustrate 2D and 3D oscillating equilibrium SSFP sequences, respectively, in accordance with an embodiment of the invention.

2D and 3D sequences which generate this oscillating steady state are shown in FIG. 2. Two TR intervals are shown. Each axis has zero net gradient area over the TR interval. During odd TRs (at left), a bipolar flow-encoding pulse follows readout on any axis. A triphasic pulse after even readouts, though not necessary, is included to mitigate imaging system nonidealities. The numbered locations correspond to spin states shown in FIG. 3. All three gradient axes are fully refocused for static spins over each TR. RF chopping is employed in this sequence; that is, the transmitter and receiver phase is incremented by 180° at each excitation. A bipolar flow-encoding gradient is included on a user-selectable axis after each odd readout. This flow-encoding gradient ideally has no effect on static spins, but causes precession $\theta_{I1}$ proportional to velocity v for moving spins:

$$\theta_{I1} = \gamma m_1 v = \gamma v \int_0^{TR} \tau G_{FE}(\tau) d\tau, \quad (4)$$

where $m_1$ is the first moment of the flow-encoding gradient waveform $G_{FE}(t)$, and $\gamma$ is the gyromagnetic ratio.

For static spins, $\theta_{I1}=\theta_{I2}=0$, and a standard steady state is produced. Therefore, $\vec{D}_{ss}=0$, for static spins. Moving spins, however, precess by $\theta^{I1}+\theta_F$ during odd TR intervals, and precess by $\theta_F$ during even intervals. This produces an oscillating steady state, with nonzero $\vec{D}_{ss}$.

Since the flow-encoding pulse is included only for its effect on the steady state, it can be located either before or after readout with little effect on performance. Two relatively minor factors led to the placement of the pulse after readout. First, this placement minimizes eddy current effects from the bipolar pulse during readout, thereby reducing image distortion. Also, this placement allows a shorter TE, and therefore better signal from spins with short $T_2^*$.

After even echoes, a three-lobed compensation pulse is present. While not strictly necessary, this pulse is intended to mitigate the effects of certain imaging system nonidealities. It is designed to have the same squared area as the flow-encoding pulse, causing the first-order concomitant-gradient Maxwell terms to be identical in even and odd TR intervals. Therefore, any concomitant gradient-induced precession will be identical for each TR and will not contribute to an oscillation in the steady state.

The compensation pulse can be further designed to match the eddy current effects of the bipolar pulse. Eddy current effects within a TR tend to cancel themselves out, but those eddy currents persisting beyond the next RF pulse can cause unequal precession from TR to TR. While the optimal compensation strategy would be machine-dependent, good matching to first order can be achieved by aligning the final ramps of the two pulses (flow-encoding and compensation) within each TR. Other methods of making the pulse sequence less sensitive to these effects are discussed below.

Figure 4A:
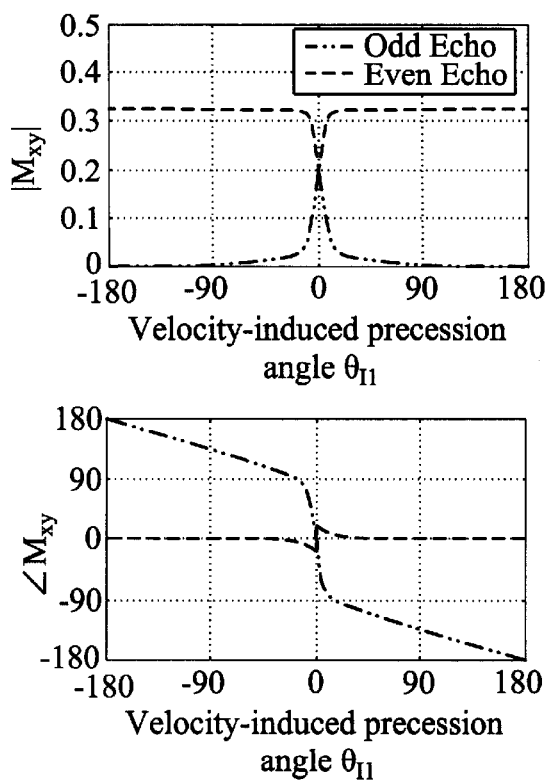
FIGS. 4(a) and 4(b) are graphs of magnitude and phase versus velocity induced precession for ODESSA echoes and for the complex sum and difference of the echoes, respectively.
Figure 4B:
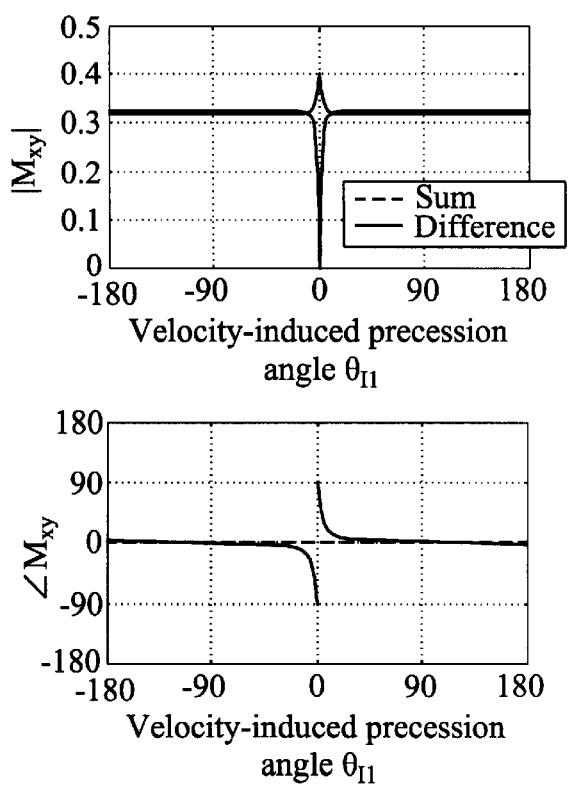

The steady-state ODESSA signal was derived analytically through a matrix inversion assuming tip angle $\alpha=30°$ $\theta_F=0$, TR=6 ms, $T_1=1000$ ms, and $T_2=220$ ms. These relaxation parameters are based on experimental measurements of fully-oxygenated arterial blood. The result (FIG. 4a) shows a marked difference between even and odd echoes for all nonzero $\theta_{I1}$. Odd echoes (during which the flow-encoding pulse occurs) exhibit nearly zero signal for all moving spins, while even echoes exhibit uniformly high signal. The signal profile for odd echoes suggests that they might be used alone in order to produce images with black blood contrast. The ODESSA signal (FIG. 4b), which is the complex difference of the two echoes, is uniformly high for all nonzero precession, with a sharp notch producing no signal for stationary spins. Furthermore, the phase of the ODESSA signal is near zero at all velocities. FIG. 4 illustrates simulated signal (top: magnitude, bottom: phase) vs. velocity induced precession $\theta_{I1}$ ($\alpha=30°$ TR=6 ms, $T_1=1000$ ms, and $T_2=220$ ms). Signal from each of the two ODESSA echoes is plotted in (a); the complex sum and difference of these echoes is shown in (b). Even echoes exhibit signal attenuation in the presence of flow, while odd echoes show signal enhancement. ODESSA signal difference is zero for static spins and uniformly large for moving spins. The horizontal axis can be converted to velocity units through Eq. [4].

Figure 5:
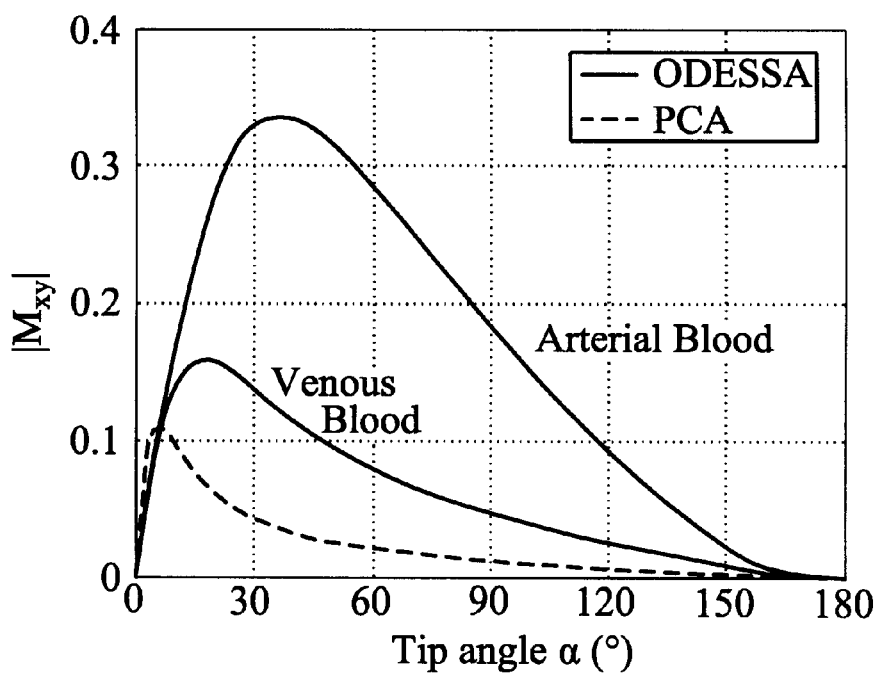
FIG. 5 is a graph of difference magnitude versus tip angle of blood using ODESSA and PCA.

While FIG. 4 was produced using specific sequence and tissue parameters, the overall characteristic of the signal (both sum and difference) is maintained over a wide range of $\alpha$, TR, $T_1$, and $T_2$. One case of interest is that of venous blood, whose $T_2$ can range from 35 ms to more than 100 ms, depending on oxygenation and effective refocusing interval. This reduced $T_2$ results in lower overall signal, as seen in FIG. 5, but the sharp stopband and uniform signal is maintained. Thus, the ODESSA sequence intrinsically suppresses venous signal in favor of arterial signal. The relative proportion of venous signal can be manipulated through proper selection of tip angle. FIG. 5 illustrates simulated difference magnitude vs. tip angle $\alpha$ ($\theta_{I1}180°$, TR=6 ms, $T_1=1000$ ms, $T_{2,arterial}=220$ ms, $T_{2,venous}=50$ ms). The ODESSA signal peak (solid lines) is broader than that of PCA (dashed line), and occurs at a higher tip angle. Unlike PCA, ODESSA signal is dependent on $T_2$; therefore, contrast is generated between arterial and venous blood. This contrast can be manipulated through judicious choice of the ODESSA tip angle. Here, a tip angle of 30° is used to generate high contrast between venous and arterial signal.

The ODESSA difference profile is particularly desirable for a number of reasons. First, it provides uniform signal for all flow rates which correspond to more than about 10° of precession (as calculated by Eq. [4]). Thus, spins moving within a broad range of speeds and directions will all exhibit equal signal. This allows a tortuous vessel to be imaged using flow encoding only along its primary direction. As long as the flow component in the direction of the flow-encoding gradient does not fall below the 10° threshold, it will provide uniform signal regardless of its orientation. Furthermore, since signal phase above this threshold does not vary significantly, signal from vessels which are superimposed will add in-phase. This facilitates projection imaging as well as imaging of thick slabs. Finally, the sequence is very sensitive to small amounts of induced precession, allowing imaging of very slow flow without the necessity of large flow-encoding gradients.

Summation of adjacent echoes, $\vec{M}_{ss1}+\vec{M}_{ss2}$, provides anatomic contrast very similar to that of a standard refocused SSFP sequence with NEX=2. The sum signal from motionless tissue is identical to that from the standard refocused SSFP sequence, while signal from moving arterial blood is slightly attenuated (79% of the static blood signal, as seen in FIG. 4b).

Figure 6:
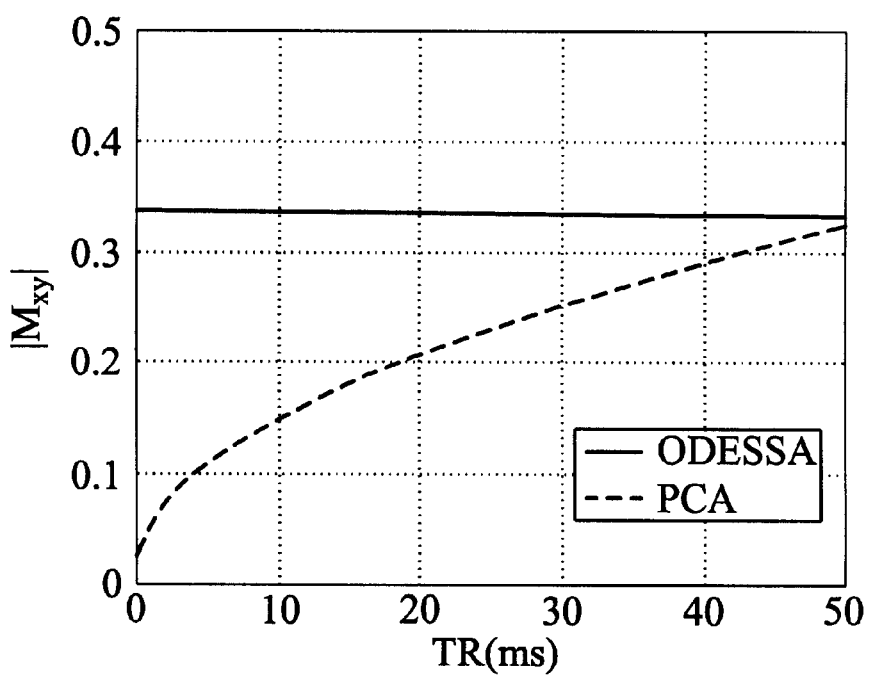
FIG. 6 is a graph difference magnitude versus TR for ODESSA and for PCA.

FIG. 6 illustrates simulated difference magnitude vs. TR ($\theta_{f1}$=180°,=1000 ms, $T_2$=220 ms). ODESSA (solid line) and PCA (dashed line) magnitudes are calculated using the maximizing tip angle for each TR. ODESSA signal is maximized by reducing TR, while PCA signal is maximized by increasing TR.

ODESSA signal strength increases as TR decreases (FIG. 6); therefore, reductions in TR while holding per-TR readout time constant will result in both higher SNR and greater scan efficiency. Furthermore, the assumption of negligible free precession $\theta_F$ is only valid at very short TRs. Therefore, this sequence should be designed to operate with the shortest possible repetition time. Signal strength is maximized for arterial blood at a tip angle near 35° for TR=6 ms (FIG. 5), while signal from venous blood is maximized at smaller tips. Therefore, a relatively large tip of α=30° is employed throughout this study in order to maximize arterial signal. If less contrast between venous and arterial blood is desired, a smaller tip in the range of 15° can be employed.

Figure 2B:
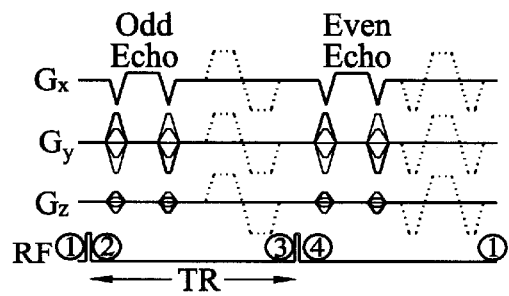
Figures 3A, 3B:
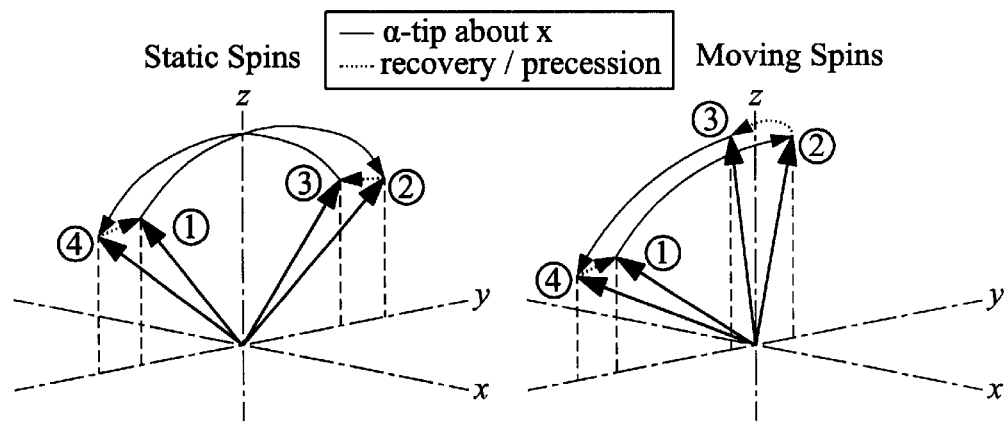
FIGS. 3(a) and 3(b) illustrate steady state magnetism for stationary and for moving spins, respectively, in pulses sequences of FIGS. 2(a) and 2(b).

FIG. 3 illustrates pictorial diagrams of steady state magnetization for (a) stationary and (b) moving spins in an ODESSA sequence. Numbered vectors correspond to labeled time points in FIG. 2. Induced precession during the 2–3 interval results in an asymmetric steady state for moving spins. Odd echoes, acquired at time point 2, experience signal attenuation due to flow. Even echoes, acquired at time point 4, experience signal enhancement due to flow.

For static tissue, excitations with alternating RF polarity cause the magnetization to oscillate about the longitudinal (z) axis. Recovery occurs identically in each TR, and the steady state is symmetric about this axis. Subtraction of the transverse component (after compensating for RF chopping) results in zero signal difference. When tissue is in motion, it precesses unequally in even and odd TR intervals, and the symmetry of the steady state is perturbed. For all moving spins, the magnetization is "tipped-up", or close to the longitudinal axis, during odd echoes (time point 2). Therefore, the exact amount of velocity-induced precession has minimal effect on the steady state magnetization. This vector is tipped into the transverse plane during even echoes (time point 4), resulting in signal enhancement. Because precession due to motion occurs when the magnetization is primarily longitudinal, phase does not accrue, and the signal difference vector remains along y.

An interesting point to note from FIG. 3 is that recovery plays a relatively minor role in the steady state for flowing spins. The combined effect of recovery and induced precession between time points 2 and 3 is small because the vector is tipped-up during this time. As a result, the counterbalancing effect of recovery during the 4–1 interval must also have a small effect on the direction and magnitude of the magnetization. Therefore, the presence of this tipped-up state is crucial to the performance of the ODESSA sequence.

To illustrate the importance of the tipped-up state, consider two minor sequence variations which alter the steady state. The new steady states do not include a tipped-up state, and as a result, the unique properties of ODESSA are lost.

As a first modification, we note that the ODESSA sequence utilizes an unbalanced acquisition, with flow-encoding occurring only on odd-numbered TRs. One might also use flow encoding gradients which alternate in polarity each TR in order to generate an oscillatory steady state. The inherent symmetry of this sequence means that the steady state will also be symmetric about the longitudinal axis. Thus, no tipped-up state is present, and recovery must have a larger effect in order to counterbalance induced precession. This causes a net reduction in the steady state vector magnitude for flowing spins, as can be seen in FIG. 7.

Figure 7:
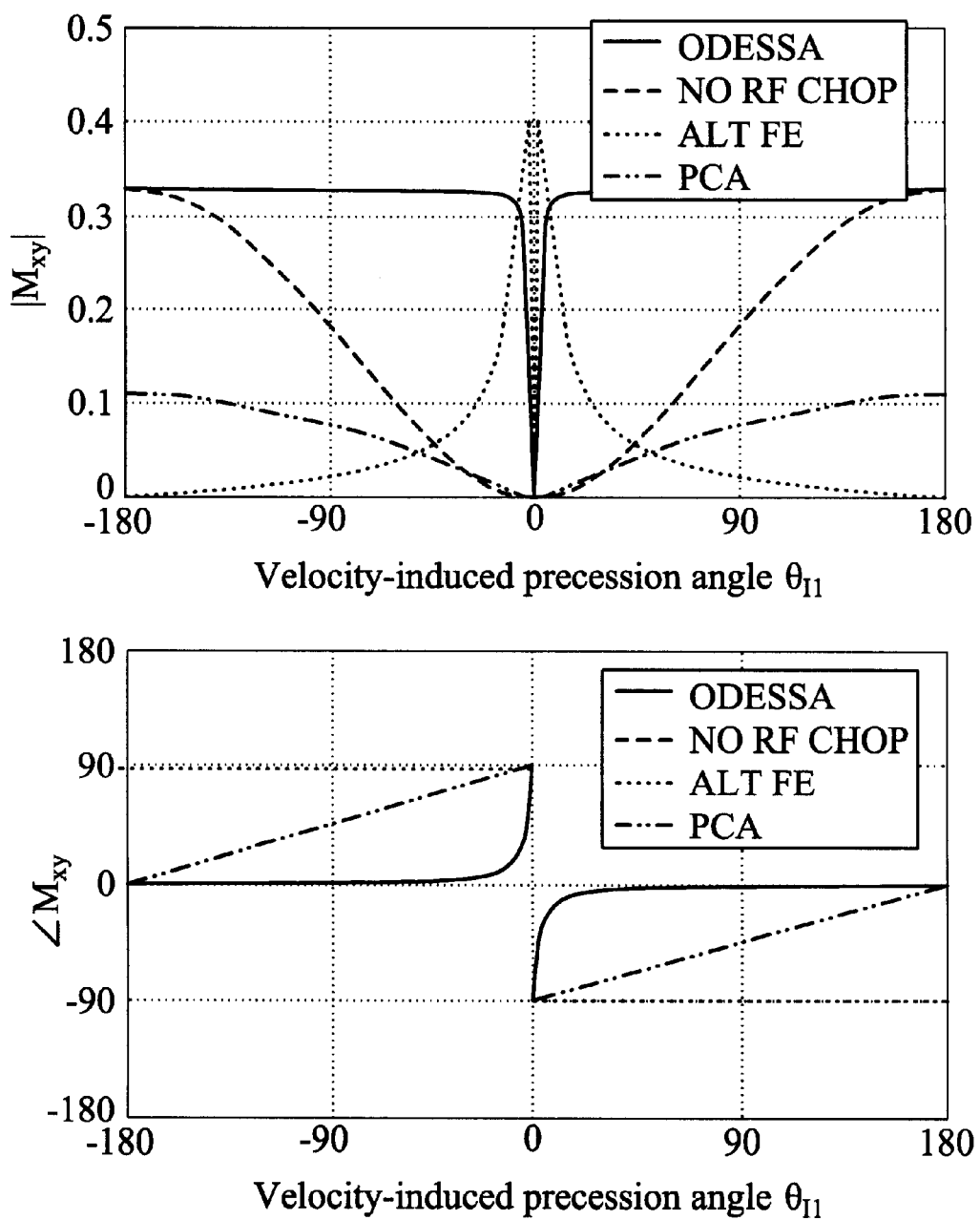
FIG. 7 is plots of magnitude and phase versus velocity-induced precession angle for ODESSA and PCA.

FIG. 7 illustrates comparison of several variations on the ODESSA sequence. Simulated signal (top: magnitude, bottom: phase) is plotted vs. velocity induced precession $\theta_{f1}$ (TR=6 ms, $T_1$=1000 ms, $T_2$=220 ms, and tip angle a set at the maximizing value for arterial blood from FIG. 5). ODESSA signal magnitude is plotted with (solid line) and without (dashed line) RF chopping. ODESSA signal phase is unaffected by chopping. The signal from an ODESSA sequence with alternating-sign flow-encoding pulses is plotted with the dotted line. Signal generated by a PCA sequence with the same TR and using the maximizing tip from FIG. 5 is also shown, for comparison.

Another possible sequence modification is to use equal RF tips, rather than the chopped RF utilized in ODESSA. Because each tip is in the same direction, magnetization is no longer tipped back to the longitudinal axis just prior to induced precession. As a result, the exact amount of precession has a more pronounced impact on the steady state. In this case, the signal magnitude is not uniform for all velocities (FIG. 7); instead, it increases with velocity similarly to phase contrast angiography, discussed next.

Comparisons were made between theoretical ODESSA signal and the signal predicted in a complex-difference PCA experiment. For flow with velocity corresponding to $\theta_{f1}$=180°, ODESSA produces over 300% of the signal of the optimal PCA sequence in the same scan time with TR<6 ms (FIG. 7). At lower velocities ($\theta_{f1}$<180°), ODESSA signal is unchanged, but PCA signal reduces dramatically. For instance, at a velocity corresponding to $\theta_{f1}$=45°, the ODESSA signal is greater than 5 times the PCA signal. As TR decreases, this advantage increases (FIG. 6).

Because signal is maintained over a range of induced precession, smaller flow-encoding gradients can be used without loss of signal. Therefore, slow flow which would require prohibitively large flow-encoding gradients in PCA studies could be imaged with ODESSA using smaller encoding gradients. Additionally, when flow is primarily along one axis, separate scans with flow-encoding gradients on each axis are not necessary. ODESSA signal can also be tailored to use $T_2$ differences between arterial and venous blood as a contrast mechanism. Finally, ODESSA does not suffer from signal loss due to intra-voxel velocity dispersion as PCA does, allowing rapid acquisition of projection images.

While ODESSA signal is zero for all spins with $\theta_{f1}=\theta_{f2}$, even a small difference between induced precession in even and odd echoes can produce a large signal difference. This sensitivity is desirable in order to produce uniform signal for all flowing material, but it also requires that extreme care be taken so that nonidealities in the imaging equipment do not cause an oscillation in the steady state. As the pulse sequence is identical in even and odd echoes except for the flow-encoding and compensation pulses, these pulses must be designed so that any precession which they induce in static tissue is identical.

As described above, the compensation pulse produces concomitant Maxwell gradients equal to those of the bipolar pulse, to first order. It is also positioned to mimic the eddy current behavior of the bipolar pulse. These efforts can be augmented by careful calibration of the gradient preemphasis network available on most commercial scanners. A method similar to that described by Papadakis (Magnetic Resonance in Medicine 2000;44:616–624) was implemented in the experiments described herein, with good results.

If these compensation strategies are not effective, the variant of the ODESSA pulse sequence without RF chopping may be utilized, as discussed above, with signal as shown in FIG. 7. This widens the effective stopband of the ODESSA sequence, allowing a larger amount of undesired precession without producing large artifacts. While none of the studies described below utilize this technique, it might be useful in situations wherein pulse compensation fails.

Figure 8:
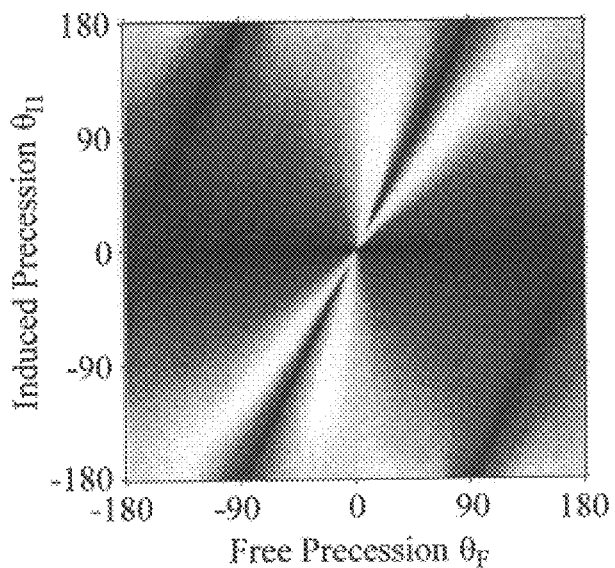
FIG. 8 illustrates ODESSA signal magnitude versus free precession and velocity-induced precession.

Another source of error which must be considered is free precession $\theta_F$. This includes all sources of precession which manifest themselves equally in even and odd TR intervals—$B_0$ inhomogeneity, chemical shift, eddy current effects, and Maxwell gradients associated with all pulses in the sequence. ODESSA signal vs. $\theta_F$ and $\theta_{f1}$ is shown in FIG. 8, which illustrates simulated ODESSA signal magnitude vs. free precession $\theta_F$ and velocity-induced precession $\theta_{f1}$ ($\alpha=30°$, TR=6 ms, $T_1=1000$ ms, $T_2=220$ ms). Signal is zero for static spins ($\theta_{f1}=0$). The vertical line at $\theta_F=0$ corresponds to ODESSA signal plotted in FIG. 4. For moving spins, modulations in signal magnitude can occur due to free precession. These modulations can be reduced by carefully shimming the main field or by combining multiple acquisitions of varying encoding polarity and magnitude. This plot shows some signal loss due to $\theta_F$ is possible in flowing vessels. In order to mitigate this effect, one could utilize two separate acquisitions which differ only in the polarity of their flow-encoding gradients. Inversion of the flow-encoding gradient would also invert the sign of induced precession. Signal from each acquisition could be summed, or the maximum point-to-point signal could be used to eliminate areas of signal loss. In the results shown here, careful shimming was used to reduce off-resonant precession to a level that made further compensation unnecessary.

Experiments described below were performed on a 1.5 T GE Signa research system (GE Medical Systems, Waukesha, Wis.) with 40 mT/m gradients switchable at 150 mT/m/ms.

Figure 9:
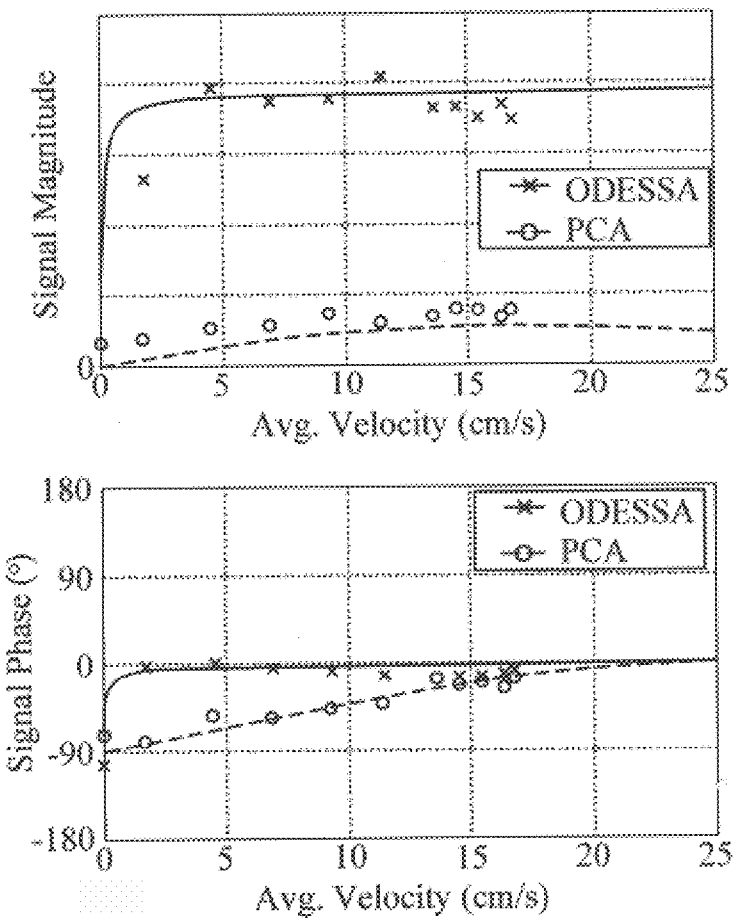
FIG. 9 is graphs of magnitude and phase observed in a flow phantom.

As a controlled verification of the ODESSA signal profile predicted by FIG. 7, experiments were conducted in a flow phantom containing a single tube of radius 0.8 cm. Slices were oriented such that the flowing material was in-plane. Both flow and flow-encoding occurred on the frequency-encoding (x) axis. The flowing material had $T_1=1383$ ms and $T_2=836$ ms. Images were taken with flow at several known velocities; the signal recorded from each of these velocities is shown in FIG. 9. FIG. 9 illustrates ODESSA signal (top: magnitude, bottom: phase) observed in the flow phantom ($\alpha=30°$, TR=6.4 ms, $T_1=1383$ ms, $T_2=836$ ms). Velocity encoding is such that 25 cm/s corresponds to 180° of precession. The signal advantage of ODESSA ('x') over PCA ('o') is consistent with the predicted by theory (lines).

Theoretical signal profiles were calculated by integrating Eq. [8] over an assumed laminar velocity profile, then scaled to best match the acquired data. Results correlate quite well with those predicted by theory. While PCA signal is close to the level of noise for all velocities, ODESSA signal is nearly an order of magnitude larger over the entire range of positive velocities.

Figure 10A:
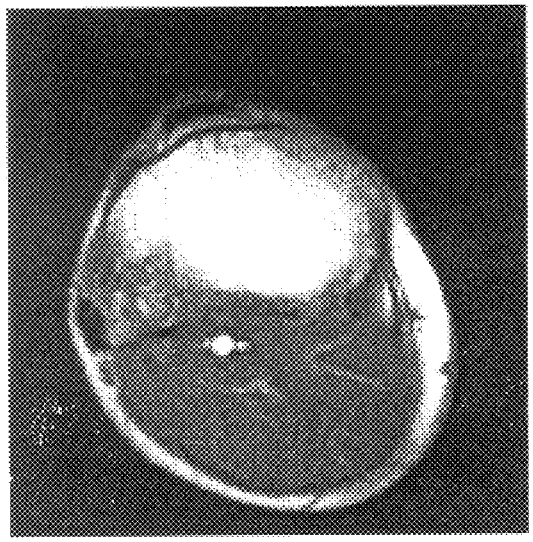
FIGS. 10(a), 10(b) are images of axial ODESSA knee images showing anatomic sum image and anatomic difference image, respectively.
Figure 10B:
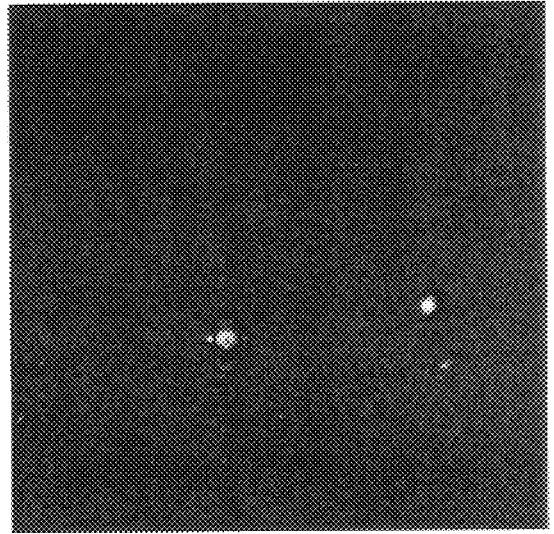

Axial knee images were acquired with flow-encoding in the through-plane direction, as illustrated in FIGS. 10(a) and 10(b). For this study, a 1.6-cm slice was imaged with matrix size 256×256, FOV=32 cm, TR=5.6 ms, TE=1.4 ms, $\alpha=30°$, and flow-encoding gradients such that 30 cm/s corresponded to a 180° phase shift. A 500-$\mu$s linear-phase SLR pulse (24) was used for rapid slice selection.

Acquisition was delayed for 2 s to allow evolution of the steady state, resulting in a total imaging time of 4.9 s. The sum image (FIG. 10a) exhibits the contrast expected from a standard refocused SSFP sequence at this tip angle. The difference image (FIG. 10b) shows suppression of static signal to the level of the image noise. Blood signal, on the other hand, is not significantly attenuated, with an SNR of approximately 64 in each image.

An artifact is visible in the phase-encode direction near the popliteal artery. This is caused by an inconsistent steady state from phase-encode line to phase-encode line due to pulsatile flow. Similar flow artifacts are routinely encountered in standard phase-contrast images; however, the underlying cause is slightly different. In a phase-contrast sequence, the flow encoding pulse causes a velocity-dependent phase accrual before readout. If flow is pulsatile, then this causes a periodic phase modulation in the k-space data, resulting in a ghosting artifact in the image.

ODESSA is not as susceptible to this intra-TR phase modulation because the flow-encoding gradient occurs after readout. Also, since magnetization is nearly longitudinal when flow encoding occurs, the steady state is not significantly affected by moderate variations in flow. However, the popliteal artery has a triphasic flow waveform, with negative or zero flow for a significant portion of the cardiac cycle. This results in a periodic steady state, which causes modulation (in both magnitude and phase) between phase-encoding lines. The result is a periodic ghosting artifact in the image, similar to that seen in a standard phase contrast image.

The 3D sequence of FIG. 2b was used to generate volumetric (3D) ODESSA data from the lower leg. For this study, a 256×256 matrix was acquired over a 24-cm coronal FOV. 32 slices were acquired over a 15-cm slab. TR was 5.82 ms with tip angle $\alpha=30°$. Flow-encoding gradients were present on the frequency-encoding axis, with 200 cm/s corresponding to 180° of induced precession. Two excitations were acquired asynchronously with the cardiac cycle in order to reduce pulsatility artifacts; therefore, total imaging time was 190 s.

Figure 11A:
FIGS. 11(a), 11(b) are images of 3D ODESSA coronal slice in the lower leg of a human showing anatomic sum image and angiographic difference image, respectively.
Figure 11B:
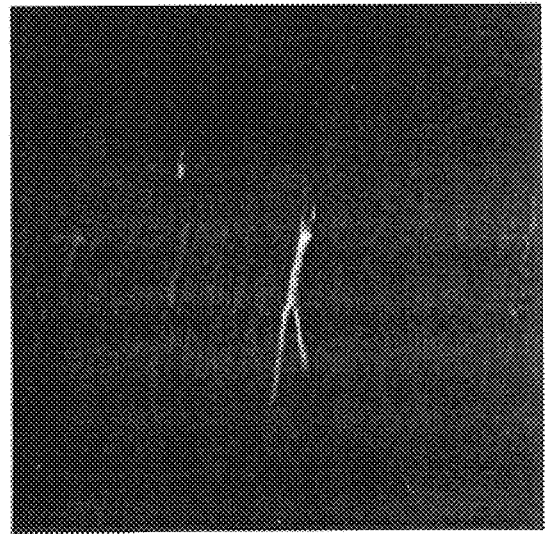

FIG. 11 illustrates coronal slice from a 3D ODESSA study in the lower leg of a healthy volunteer. FIG. 10(a) is anatomic sum image, and FIG. 10(b) is angiographic difference image. The popliteal bifurcation is clearly visualized (SNR=29). This exam took 190 s; two excitations were used to reduce pulsatility artifacts.

Figure 12:
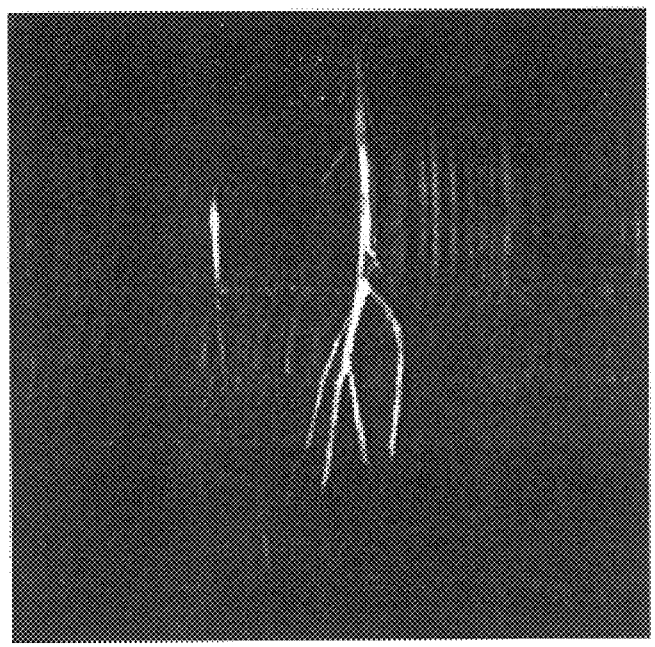
FIG. 12 is a 3D image of a lower-leg arterial tree generated from ODESSA data.

Individual slices from this study (FIG. 11) are qualitatively similar to those acquired in the single-slice study. A maximum-intensity projection of the image data (FIG. 12) shows the arterial tree very well. Veins are less conspicuous because of the reduced $T_2$ of venous blood; a smaller tip angle could be employed to increase the relative venous signal if desired.

This study uses smaller flow-encoding gradients than the single-slice study above; however, blood signal remains high due to the near-constant ODESSA signal vs. precession angle (as in FIG. 7). This characteristic allows the pulse sequence designer more flexibility in choosing the duration of flow-encoding gradients without sacrificing blood signal.

We have demonstrated a method of producing angiographic contrast with a refocused SSFP experiment. In so doing, the relatively high SNR efficiency of SSFP sequences is maintained. Simulations predict ODESSA signal to be uniform over a wide range of velocities, and more than three times as large as that of conventional phase contrast angiography in the same scan time. Additionally, ODESSA signal has highly uniform phase, reducing the effects of intravoxel velocity dispersion and making thick-slab projection angiography possible. Phantom experiments verify the advantages predicted by simulation.

Figure 13:
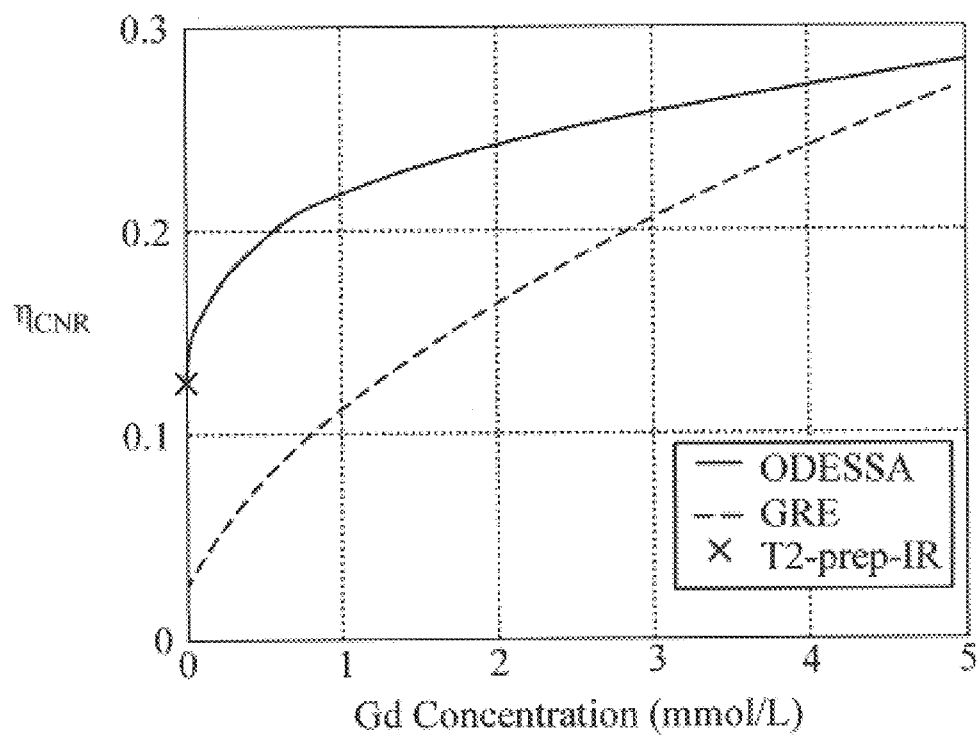
FIG. 13 is a plot of normalized scan efficiency of the ODESSA process and gradient-echo imaging versus concentration of contrast agent.

ODESSA can also be used in combination with $T_1$-shortening contrast agents such as GdDTPA to further enhance blood signal. FIG. 13 shows predicted ODESSA signal versus concentration of contrast. Signal from arterial blood in a standard gradient-echo acquisition using the same scan time is also shown. For Gd-DTPA concentrations up to 5 mmol/L, ODESSA provides a significant contrast improvement over the conventional technique. In fact, ODESSA provides the equivalent of 1–2 mmol/L of additional contrast over this range of concentrations.

The ODESSA pulse sequence can produce non-contrast angiograms quickly, with high blood signal and virtually no signal from background tissue. Furthermore, this sequence intrinsically suppresses venous signal due to its reduced $T_2$. The technique compares favorably with other methods of non-contrast MR angiography, and can provide an additional signal boost in contrast-enhanced studies.

While the invention has been described with reference to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A method of magnetic resonance angiography comprising the steps of:
    a) placing an object to be imaged in a static magnetic field,
    b) applying an RF pulse and axial gradients to the object,
    c) detecting first signals from nuclei in the object,
    d) applying an RF pulse, axial gradient, and a bipolar flow-encoding pulse,
    e) detecting second signals from nuclei in the object,
    f) repeating steps b) and c) to establish a steady state of first signals,
    g) repeating steps d) and e) to establish a steady state of second signals, and
    h) subtracting the steady state of first signals from the steady state of second signals to obtain signals of non-static material.

2. The method as defined by claim 1 wherein steps b) and c) and steps d) and e) are repeated sequentially in order to produce a steady state which oscillates between first and second signals.

3. The method as defined by claim 1 wherein steps b) and c) are repeated a multiple of times for each of steps d) and e).

4. The method as defined by claim 1 wherein step b) includes applying a three-lobed compensation pulse to mitigate the effects of eddy currents, concomitant Maxwell gradients, and acceleration.

5. The method as defined by claim 1 wherein step d) the bipolar flow-encoding pulse follows step e).

6. The method as defined by claim 1 wherein in step d) the bipolar flow-encoding pulse precedes step e).

7. The method as defined by claim 1 wherein step h) provides two dimensional image signals.

8. The method as defined by claim 1 wherein step h) provides three dimensional image signals.

9. The method as defined by claim 1 wherein in step d) the bipolar pulse is applied on any axis.

10. The method as defined by claim 1 wherein in step d) bipolar pulse is applied on a combination of axes.

11. The method as defined by claim 1 wherein in step d) the bipolar pulse is changed at each iteration or groups of iterations.

12. The method as defined by claim 1 wherein in steps b) and d) RF phase is constant.

13. The method as defined by claim 1 wherein in steps b) and d) RF phase is incremented for each RF pulse.

14. A method of magnetic resonance angiography comprising the steps of:
    a) placing an object to be imaged in a static magnetic field,
    b) applying a first refocused steady state precession pulse and gradient sequence to obtain first signals from nuclei in the object;
    c) applying a second refocused steady state precession pulse and gradient sequence including a bipolar flow encoding pulse to obtain second signals from nuclei in the object,
    d) repeating step b) to establish a steady state of first signals,
    e) repeating step c) to establish a steady state of second signals, and
    f) subtracting the steady states of first signals and second signals to obtain signals of non-static material.

15. The method as defined by claim 14 wherein steps b) and c) are repeated sequentially in order to produce a steady state which oscillates between first and second signals.

16. The method as defined by claim 14 wherein step b) is repeated a multiple of times for each step c).

17. The method as defined by claim 14 wherein step b) includes applying a three-lobed compensation pulse to mitigate the effects of eddy currents, concomitant Maxwell gradients, and acceleration.

18. The method as defined by claim 14, wherein in step c) the bipolar flow-encoding pulse follows second signal detection.

19. The method as defined by claim 14 wherein in step c) the bipolar flow encoding pulse precedes second signal detection.

20. The method as defined by claim 14 wherein step f) provides two dimensional image segments.

21. The method as defined by claim 14 wherein step f) provides three dimensional image signals.

22. The method as defined by claim 14 wherein in step c) the bipolar pulse is applied on any axis.

23. The method as defined by claim 14 wherein in step c) the bipolar pulse is applied on a combination of axes.

24. The method as defined by claim 14 wherein in step c) the bipolar pulse is changed at each iteration or groups of iterations.

25. The method as defined by claim 14 wherein in steps b) and c) RF phase is constant.

26. The method as defined by claim 14 wherein in steps b) and c) RF phase is incremented for each sequence.

* * * * *